US011496155B2

United States Patent
Declercq et al.

(10) Patent No.: US 11,496,155 B2
(45) Date of Patent: Nov. 8, 2022

(54) METHOD AND APPARATUS FOR VERTICAL LAYERED DECODING OF QUASI-CYCLIC LOW-DENSITY PARITY CHECK CODES USING PREDICTIVE MAGNITUDE MAPS

(71) Applicant: Codelucida, Inc., Tucson, AZ (US)

(72) Inventors: David Declercq, Tucson, AZ (US); Vamsi Krishna Yella, Tucson, AZ (US); Benedict J. Reynwar, Tucson, AZ (US)

(73) Assignee: Codelucida, Inc., Tucson, AZ (US)

( * ) Notice: Subject to any disclaimer, the term of this patent is extended or adjusted under 35 U.S.C. 154(b) by 0 days.

(21) Appl. No.: 17/224,064

(22) Filed: Apr. 6, 2021

(65) Prior Publication Data
US 2022/0085828 A1    Mar. 17, 2022

Related U.S. Application Data

(60) Provisional application No. 63/007,871, filed on Apr. 9, 2020.

(51) Int. Cl.
*H03M 13/11* (2006.01)
*H03M 13/31* (2006.01)
*H03M 13/37* (2006.01)

(52) U.S. Cl.
CPC ...... *H03M 13/116* (2013.01); *H03M 13/1108* (2013.01); *H03M 13/1114* (2013.01); *H03M 13/31* (2013.01); *H03M 13/3746* (2013.01)

(58) Field of Classification Search
CPC ........... H03M 13/116; H03M 13/1108; H03M 13/3746; H03M 13/31; H03M 13/1114
See application file for complete search history.

(56) References Cited

U.S. PATENT DOCUMENTS

7,519,895 B2    4/2009    Kyung
8,161,345 B2    4/2012    Graef
(Continued)

FOREIGN PATENT DOCUMENTS

EP    2273683    1/2011
EP    2833553    2/2015

OTHER PUBLICATIONS

Angarita et al. "Reduced-complexity min-sum algorithm for decoding IDPC codes with low error-floor," IEEE Transactions on Circuits and Systems—I: Regular Papers, IEEE, Jul. 1, 2014, 61(7):2150-2158.
(Continued)

*Primary Examiner* — Thien Nguyen
(74) *Attorney, Agent, or Firm* — Fish & Richardson P.C.

(57) ABSTRACT

A method and apparatus for decoding quasi-cyclic LDPC codes using a vertical layered iterative message passing algorithm. The algorithm of the method improves the efficiency of the check node update by using one or more additional magnitudes, predicted with predictive magnitude maps, for the computation of messages and update of the check node states. The method allows reducing the computational complexity, as well as the storage requirements, of the processing units in the check node update. Several embodiments for the apparatus are presented, using one or more predictive magnitude maps, targeting significant savings in resource usage and power consumption, while minimizing the impact on the error correction performance loss.

16 Claims, 6 Drawing Sheets

(56) References Cited

U.S. PATENT DOCUMENTS

| | | | |
|---|---|---|---|
| 8,458,556 | B2 | 6/2013 | Planjery et al. |
| 8,510,624 | B2 | 8/2013 | Kim et al. |
| 8,918,694 | B2 | 12/2014 | Marero et al. |
| 9,015,550 | B2 | 4/2015 | Wang et al. |
| 9,048,867 | B2 | 6/2015 | Liu et al. |
| 9,331,716 | B2 | 5/2016 | Panteleev et al. |
| 9,459,956 | B2 | 10/2016 | Hubris et al. |
| 9,553,608 | B2 | 1/2017 | Li et al. |
| 10,110,249 | B2 | 10/2018 | Zhang et al. |
| 10,367,526 | B2 | 7/2019 | Liu et al. |
| 10,530,392 | B2 * | 1/2020 | Reynwar ............ H03M 13/1117 |
| 10,594,339 | B2 | 3/2020 | Panteleev et al. |
| 10,651,872 | B2 | 5/2020 | Savin et al. |
| 10,778,251 | B2 | 9/2020 | Declercq et al. |
| 11,258,460 | B2 | 2/2022 | Declercq et al. |
| 2003/0126551 | A1 | 7/2003 | Mantha et al. |
| 2005/0149842 | A1 | 6/2005 | Kyung et al. |
| 2005/0229090 | A1 | 10/2005 | Shen et al. |
| 2006/0036926 | A1 | 2/2006 | Hocevar |
| 2007/0283219 | A1 | 12/2007 | Park et al. |
| 2014/0223254 | A1 | 8/2014 | Pisek |
| 2014/0229792 | A1 | 8/2014 | Varnica et al. |
| 2017/0141796 | A1 | 5/2017 | Koike-Akino et al. |
| 2017/0244515 | A1 | 8/2017 | Razzetti et al. |
| 2018/0062666 | A1 * | 3/2018 | Zhang ................. G06F 11/1068 |
| 2019/0044537 | A1 * | 2/2019 | Reynwar ............ H03M 13/1117 |
| 2020/0044667 | A1 | 2/2020 | Declercq et al. |
| 2020/0220557 | A1 * | 7/2020 | Reynwar ............ H03M 13/1137 |
| 2021/0391872 | A1 | 12/2021 | Declercq et al. |

OTHER PUBLICATIONS

Cai et al., "Low-Complexity Finite Alphabet Iterative Decoders for LDPC Codes," IEEE International Symposium on Circuits and Systems, May 2013, 1332-1335.

Cai, Fang et al.: "Finite Alphabet Iterative Decoders for LDPC Codes: Optimization, Architecture and Analysis", IEEE Transactions on Circuits and Systems I: Regular Papers, IEEE, US, vol. 61, No. 5,May 1, 2014 (May 1, 2014), pp. 1366-1375, XP011546491, ISSN: 1549-8328, DOI: 10.1109/TCSI.2014.2309896 [retrieved on Apr. 24, 2014].

Catala-Perez et al. "Second minimum approximation for min-sum decoders suitable for high-rate IDPC codes," Circuits, Systems and Signal Processing, Apr. 5, 2019, 38(11):5068-5080.

Cui et al., "Reduced-complexity column-layered decoding and implementation for LDPC codes," IET Commun, 2011, 5(15): 2177-2186.

Declercq et al., "An Imprecise Stopping Criterion Based on In-Between Layers Partial Syndromes," IEEE Communications Letters, Jan. 2018, 22(1): 13-16.

Declercq et al., "Approaching Maximum Likelihood decoding of finite length LDPC codes via FAID diversity," IEEE Information Theory Workshop, 2012, 487-491.

Declercq et al., "Finite Alphabet Iterative Decoders—Part II: Towards Guaranteed Error Correction of LDPC Codes via Iterative Decoder Diversity," IEEE Transactions on Communications, Oct. 2013, 61(10): 4046-4057.

Extended European Search Report in European Appln No. 21167522. 8, dated Aug. 9, 2021, 15 pages.

Extended European Search Report, dated Jul. 6, 2020, corresponding to European Application No. EP 18841488.2, 19 pages.

Hocevar, "A Reduced Complexity Decoder Architecture via Layered Decoding of LDPC Codes," IEEE SIPS, 2004, 107-112.

International Search Report and Written Opinion of the International Searching Authority, PCT Application No. PCT/US19/45001, dated Oct. 29, 2019, 10 pages.

International Search Report and Written Opinion of the International Searching Authority, PCT Application No. PCT/US2018/044691, dated Oct. 30, 2018, 12 pp.

Kanchetla, Vijaya Kumar et al.: "Multi-standard high-throughput and low-power quasi-cyclic low density parity check decoder for worldwide interoperability for microwave access and wireless fidelity standards", IET Circuits Devices and Systems, The Institution of Engineering and Technology, GB, vol. 10, No. 2,Mar. 1, 2016 (Mar. 1, 2016), pp. 111-120, XP006076546, ISSN: 1751-858X, DOI: 10.1049/IET-CDS.2014.0347.

Li, Rongchun et al: "A multi-standard efficient column-layered LDPC decoder for Software Defined Radio on GPUs", Proc., IEEE 14th Workshop on Signal Processing Advances in Wireless Communications, SPAWC, Jun. 16, 2013 (Jun. 16, 2013), pp. 724-728, XP032490422, ISSN: 1948-3244, DOI: 10.1109/SPAWC.2013. 6612145 [retrieved on Sep. 25, 2013].

Nguyen-Ly et al., "Analysis and Design of Cost-Effective High-Throughput LDPC Decoders," IEEE Transactions on Very Large Scale Integration (VLSI) Systems, Mar. 2018, 26(3): 508-521.

Planjery et al., "Finite alphabet iterative decoders—Part I: Decoding Beyond Belief Propagation on the Binary Symmetric Channel," IEEE Transactions on Communications, Oct. 2013, 61(10): 4033-4045.

Planjery et al., "Finite alphabet iterative decoders LDPC codes surpassing floating-point iterative decoders," Electronic Letters, Aug. 2011, 47(16): 2 pages.

Radosavljevic et al., "Optimized Message Passing Schedules for LDPC Decoding," IEEE Signals, Systems and Computers, Oct. 2005, 591-595.

Sharon et al., "Efficient Serial Message-Passing Schedules for LDPC decoding," IEEE Transactions on Information Theory, Nov. 2007, 53(11): 4076-4091.

Vasic and Milenkovic, "Combinatorial Constructions of Low-Density Parity-Check Codes for Iterative Decoding," IEEE Transactions on Information Theory, Jun. 2004, 50(6): 1156-1176.

Zhang and Fossorier, "Transactions Letters: Shuffled Iterative Decoding," IEEE Transactions on Communications, Feb. 2005, 53(2): 209-213.

Zhang et al., "Efficient column-layered decoders for single block-row quasi-cyclic LDPC codes," IEEE International Symposium on Circuits and Systems, Jun. 1, 2014, 413-416.

Wang et al.: "VLSI Design for Low-Density Parity-Check Code Decoding", IEEE Circuits and Systems Magazine, IEEE Service Center, New York, NY, US, vol. 11, No. 1,Jan. 1, 2011 (Jan. 1, 2011), pp. 52-69, XP011348868, ISSN: 1531-636X, DOI: 10.1109/MCAS.2010.939785.

* cited by examiner

METHOD AND APPARATUS FOR VERTICAL LAYERED DECODING OF QUASI-CYCLIC LOW-DENSITY PARITY CHECK CODES USING PREDICTIVE MAGNITUDE MAPS

CROSS-REFERENCE TO RELATED APPLICATION

This application claims priority to U.S. Provisional Patent Application No. 63/007,841, filed Apr. 9, 2020, the entire contents of which are incorporated herein by reference.

FIELD OF INVENTION

This invention generally relates to error correction coding for information transmission, storage and processing systems, such as wired and wireless communications systems, optical communication systems, computer memories, mass data storage systems, etc. More particularly, it relates to the simplification and the optimization of the low complexity implementation of vertical layered iterative decoders for low-density parity check (LDPC) codes, and more specifically to LDPC codes composed of block circulant permutation matrices, called quasi-cyclic LDPC (QC-LDPC) codes.

BACKGROUND OF THE INVENTION

Error correcting codes play a vital role in communication, computer, and storage systems by ensuring the integrity of data. The past decades have witnessed a surge in research in coding theory which resulted in the development of efficient coding schemes based on LDPC codes. Iterative message passing decoding algorithms together with suitably designed LDPC codes have been shown to approach the information-theoretic channel capacity in the limit of infinite codeword length. LDPC codes are standardized in a number of applications such as wireless networks, satellite communications, deep-space communications, and power line communications.

For an (N, K) LDPC code with length N and dimension K, the parity check matrix (PCM) H of size $M \times N = (N-K) \times N$ (assuming that H is full rank) is composed of a small number of non-zero entries, i.e. a small number of ones. We denote the degree of the n-th column, i.e. the number of ones in the n-th column, by $d_v(n)$, $1 \leq n \leq N$. Similarly, we denote the degree of the m-th row, i.e. the number of ones in the m-th row, by $d_c(m)$, $1 \leq m \leq M$. Further, we define the maximum degree for the rows and columns:

$$\gamma = \max_{1 \leq n \leq N} d_v(n) \quad \rho = \max_{1 \leq m \leq M} d_c(m) \quad (1)$$

When the number of ones in the columns and the rows of H is constant, the LDPC code is said to be regular, otherwise the LDPC code is said to be irregular. For regular LDPC codes, we have $\gamma = d_v = d_v(n)$, $1 \leq n \leq N$, and $\rho = d_c = d_c(m)$, $1 \leq m \leq M$. The $(d_v, d_c)$-regular LDPC codes represent a special interesting type of LDPC codes. For this type, the code rate is $R = K/N = 1 - d_v/d_c$ if the PCM H is full rank. Except when it is necessary for the clarity of the argumentation, we will drop the indices n or m in the notations for the degrees of the rows and columns. It is clear however, that all embodiments of the present invention apply both for regular and irregular LDPC codes.

If a binary column vector of length N, denoted $x = [x_1, x_2, \ldots, x_N]^T$ is a codeword, then it satisfies $Hx = 0$, where the operations of multiplication and addition are performed in the binary field GF(2), and 0 is the length-M all-zero column vector. $x^T$ denotes the transposition of x, both for vectors and matrices. An element in a matrix can be denoted indifferently by $H_{m,n}$ or $H(m, n)$. Similarly, an element in a vector is denoted by $x_n$ or $x(n)$. The horizontal concatenation and vertical concatenation, of vectors and matrices are denoted [A, B] and [A; B], respectively.

The present invention relates to the class of QC-LDPC. In QC-LDPC codes, the PCM H is composed of square blocks or sub-matrices of size L×L, as described in equation (2), in which each block $H_{i,j}$ is either (i) a all-zero L×L block, or (ii) a circulant permutation matrix (CPM).

$$H = \begin{bmatrix} H_{1,1} & H_{1,2} & \ldots & H_{1,N_b} \\ H_{2,1} & H_{2,2} & \ldots & H_{2,N_b} \\ \vdots & \vdots & \vdots & \vdots \\ H_{M_b,1} & H_{M_b,2} & \ldots & H_{M_b,N_b} \end{bmatrix} \quad (2)$$

A CPM is defined as the power of a primitive element of a cyclic group. The primitive element is defined, for example, by the L×L matrix $\alpha$ shown in equation (3) for the case of L=8. As a result, a CPM $\alpha^k$ with $k \in \{0, \ldots, L-1\}$ has the form of the identity matrix, shifted k positions to the left. Said otherwise, the row-index of the nonzero value of the first column of $\alpha^k$ is k+1. The value of k is referred to as the CPM value. The main feature of a CPM is that it has only a single nonzero element in each row/column and can be defined by its first row/column together with a process to generate the remaining rows/columns. The simplicity of this process translates to low complexity needed for realizing physical connections between subsets of codeword bits and subsets of parity check equations in an QC-LDPC encoder or decoder.

$$\alpha = \begin{bmatrix} 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{bmatrix} \quad (3)$$

The PCM of a QC-LDPC code can be conveniently represented by a base matrix (or protograph matrix) B, with $M_b$ rows and $N_b$ columns, which contains integer values, indicating the powers of the primitive element for each block $H_{i,j}$. Consequently, the dimensions of the base matrix are related to the dimensions of the PCM the following way: $M = M_b L$, $N = N_b L$, and $K = K_b L$ (assuming that H is full rank). An example of matrices H and B for $M_b \times N_b = 4 \times 5$ and $L = 8$ is shown in equation (4).

$$H = \begin{bmatrix} \alpha^7 & \alpha^1 & \alpha^4 & \alpha^3 & 0 \\ \alpha^2 & 0 & \alpha^3 & I & \alpha^4 \\ \alpha^4 & \alpha^6 & 0 & I & \alpha^2 \\ I & \alpha^2 & \alpha^7 & 0 & \alpha^5 \end{bmatrix} \quad B = \begin{bmatrix} 7 & 1 & 4 & 3 & -\infty \\ 2 & -\infty & 3 & 0 & 4 \\ 4 & 6 & -\infty & 0 & 2 \\ 0 & 2 & 7 & -\infty & 5 \end{bmatrix} \quad (4)$$

where $I=\alpha^0$ is the identity matrix, and by convention $\alpha^{-\infty}=0$ is the all-zero L×L matrix.

The parity-check matrix H can also be represented by a bipartite Tanner graph C, consisting of a set of variable nodes (VNs) $V=\{v_1, v_2, \ldots, v_N\}$ of cardinality N, and a set of check nodes (CNs) $C=\{c_1, c_2, \ldots, c_M\}$ of cardinality M. The variable nodes represent the codeword bits and the check nodes represent the parity-check equations, of the LDPC code. Variable nodes and check nodes are connected by edges where an edge exists between nodes $c_m$ and $v_n$ if the matrix element in the parity-check matrix is equal to $H_{m,n}=1$. The degree of check node $c_m$, denoted $d_c(m)$, is the number of variable nodes it is connected to, and the degree of variable node $v_n$, denoted $d_v(n)$, is the number of check nodes it is connected to. An LDPC code is said to be regular if its Tanner Graph has a constant variable node degree $d_v(n)=d_v$, $\forall n$, and a constant check node degree $d_c(m)=d_c$, $\forall m$. The LDPC code is said to be irregular otherwise. Let us further denote by $\mathcal{N}(c_m)$ the set of variable nodes connected to $c_m$, and by $\mathcal{N}(v_n)$ the set of check nodes connected to $v_n$.

An iterative decoder operating on a Tanner graph of an LDPC code exchanges messages between the VNs and the CNs, along the edges connecting the two kinds of nodes. An edge supports messages in the two directions: variable-to-check messages, denoted $\mu_{v_n,c_m}$ and check-to-variable messages, denoted $\mu_{c_m,v_n}$.

Also relevant to this invention is the concept of layered decoding that is used to improve the decoder convergence speed while still maintaining a low complexity. Layered LDPC decoding schemes effectively improve the convergence by reducing the required number of decoding iterations needed to reach successful decoding. A layered decoder produces messages from a subset of the check nodes to a subset of the variable nodes, and then produces messages from a subset of the variable nodes to a subset of the check nodes.

Let us now define the concept of layers in QC-LDPC codes. For QC-LDPC codes, a row-layer is typically composed of L consecutive rows of the PCM, defined by a set of L×L circulant permutation matrices. For example, the i-th block-row in equation (2) defines the i-th row-layer. Similarly, a column-layer is composed of L consecutive columns of the PCM. For example, the j-th block-column in equation (2) defines the j-th column-layer. More generally, a row-layer could be composed of a plurality of block-rows of CPMs, and a column-layer could be composed of a plurality of block-columns. For ease of presentation, we will assume in this invention, that a row-layer is composed of only one block-row and that a column-layer is composed of only one block-column. The skilled in the art could easily generalize the descriptions in this invention to other layer organizations.

An iterative decoder is usually defined by the VN update (VNU) rule, the CN update (CNU) rule, and the scheduling of the message computation. The scheduling defines the order in which the VNU and the CNU operations are performed in the entire Tanner graph of the LDPC code. There are three main types of scheduling for iterative message-passing LDPC decoders: (i) the flooding schedule, (ii) the horizontal layered (HL) scheduling, (iii) the vertical layered (VL) scheduling. The HL and VL schedules are typically used in conjunction with QC-LDPC codes. In HL decoding the message updating is performed row-layer by row-layer, while in VL decoding the message computation is performed column-layer by column-layer.

The present invention applies to any binary input symmetric channel, and can be generalized easily to channels with non-binary inputs. Let x be a codeword of a length N QC-LDPC code. The codeword is sent over a noisy memoryless channel with outputs y, which values belong to a q-ary alphabet $\mathcal{y}$. The channel precision $n_q$ is the number of bits required to represent the q-ary alphabet, i.e. $2^{n_q} \geq q$. The inputs of the decoder, denoted channel values, can be defined by the quantized measurements of the noisy channel, i.e. the values of y, or by any transformation of these measurements. For example, and without loss of generality, the channel values can be defined as log-likelihood ratios (LLRs), computed from the conditional channel probabilities, equal to LLR(y)=prob (y|x=0)/prob (y|x=1).

The embodiments of the present invention are further related to a class of iterative message-passing decoders called finite alphabet iterative decoders (FAIDs). In these decoders, the messages $\mu_{c,v}$ and $\mu_{v,c}$ belong to a finite alphabet $\mathcal{M}$ which consists of a finite—typically small—number of levels, denoted s. The s levels can be represented using $n_s$ bits of precision, such that $2^{n_s} \geq s$. For the specific illustrative case where $\mathcal{M}$ has odd cardinality, the message alphabet is denoted $$\mathcal{M} = \left\{0, \pm a_k : 1 \leq k \leq \frac{s-1}{2}\right\}$$

where $a_k \geq a_l$ for any k>l. Note that the message alphabet and the channel alphabet can have different cardinalities, s≠q.

The variable node update for a variable node v of degree $d_v$ in a FAID is implemented using a pre-defined function $\Phi_v: \mathcal{y} \times \{\mathcal{M}\}^{d_v-1} \to \mathcal{M}$ which in this description is referred to as VN update function. It computes the outgoing message on a particular edge as a function of a channel value y and $d_v-1$ incoming messages at the node, excluding the incoming message on that particular edge. For example, to compute the output message $$\mu_{v,c_{d_v}},$$

we use:

$$\mu_{v,c_{d_v}} = \Phi_v(y, \mu_{c_1,v}, \ldots, \mu_{c_{d_v-1},v}) \quad (5)$$

$$\mu_{c_1,v} \in \mathcal{M} \ldots \mu_{c_{d_v-1},v} \in \mathcal{M}$$

The VN update function can be optimized to improve the error-correction capability of the decoder. The VN update function for the channel value y=+Y can be deduced from the one with channel value y=−Y by symmetry:

$$\Phi_v(Y, \mu_{c_1,v}, \ldots \mu_{c_{d_v-1},v}) = -\Phi_v(-Y, -\mu_{c_1,v}, \ldots, -\mu_{c_{d_v-1},v}) \quad (6)$$

The check node update function $\Phi_c$ used in FAID is similar to the function used in the min-sum decoder which is typically used in the state-of-the-art. If $$\mu_{v_1,c}, \ldots, \mu_{v_{d_c-1},c}$$

represent the incoming messages to a node c with degree $d_c$ then $\Phi_c$ is given by $$\mu_{c,v_{d_c}} = \Phi_c(\mu_{v_1,c}, \ldots, \mu_{v_{d_c-1},c}) = \left(\prod_{k=1}^{d_c-1} \text{sign}(\mu_{v_k,c})\right) \min_{1 \leq k \leq d_c-1}(|\mu_{v_k,c}|). \quad (7)$$

Depending on the scheduling type that is used, the CNU can be implemented in various ways. The specifics about the CNU implementation for VL decoding will be presented subsequently.

Finally, in order to compute a hard-decision estimate of the codeword bit for the VN v, an a posteriori probability (APP) is computed using:

$$APP(v) = \Phi_{APP}(y, \mu_{c_1,v}, \ldots, \mu_{c_{d_v},v}) \quad (8)$$

$$\mu_{c_1,v} \in \mathcal{M} \ldots \mu_{c_{d_v},v} \in \mathcal{M}$$

The hard-decision estimate of the n-th codeword bit, denoted $\hat{x}_n$ is equal to:

$$\begin{cases} \hat{x}_n = 0 & \text{if } APP(v_n) > 0 \\ \hat{x}_n = 1 & \text{if } APP(v_n) < 0 \\ \hat{x}_n = \dfrac{1 - \text{sign}(y_n)}{2} & \text{if } APP(v_n) = 0 \end{cases} \quad (9)$$

If the hard decision estimates have a syndrome equal to zero, i.e., $$H\hat{x} = s = 0 \quad (10)$$

then the decoder has successfully converged to a valid codeword.

Let us now describe the general principle of VL decoding of QC-LDPC codes, with a focus on the memory organization and the CNU processing. For each CN $c_m$ connected to $d_c$ VNs, there are $d_c$ incoming variable-to-check messages to the CNU, denoted $\mu_{v_n,c_m}, \forall v_n \in \mathcal{N}(c_m)$. The messages can be written in sign-magnitude representation $\mu_{v_n,c_m} = \text{sign}_{m,n} \text{mag}_{m,n}$, where $\text{sign}_{m,n}$ is the sign of the message and $\text{mag}_{m,n}$ its magnitude. We further define $\text{index}_{m,n}$ as the index of the block-column containing the n-th VN connected to check node $c_m$. Alternatively, $\text{index}_{m,n}$ can represent the index of the edge, among $d_c$ edges, connecting $v_n$ to $c_m$. Both conventions for $\text{index}_{m,n}$ aim at defining the position of the message $\mu_{v_n,c_m}$ that is processed.

To each and every CN $c_m$, we associate a check node state (CNS), defined as $$CNS(c_m) = \{s_m; (\text{mag}_1, \text{index}_1), \ldots, (\text{mag}_k, \text{index}_k), \ldots, \quad (11)$$

$$(\text{mag}_{d_c}, \text{index}_{d_c})\}$$

$$= \{s_m; MAG(d_c)\}$$

where $s_m = \prod_{n=1}^{d_c} \text{sign}_{m,n}$ is the syndrome bit corresponding to check node $c_m$, and MAC ($d_c$) is referred to as the magnitude state, which is composed of $d_c$ pairs. A pair ($\text{mag}_k, \text{index}_k$) in the magnitude state will be referred to as a magnitude pair. In a magnitude state, the magnitudes are sorted in ascending order:

$$\text{mag}_1 \leq \text{mag}_2 \leq \ldots \leq \text{mag}_k \leq \ldots \leq \text{mag}_{d_c}$$

and the value of $\text{index}_k$ indicates the block-column index corresponding to the one where the message is equal to $\text{mag}_k$. We further assume, for ease of presentation, that each CN has at most one VN neighbor in each block-column of the parity check matrix, i.e. $\text{index}_k \neq \text{index}_l$, $k \neq l$. This condition is not mandatory for VL decoding, and the algorithm can be extended easily when a CN has more than one neighbor in the block-columns.

A general VL iterative decoder is presented in Algorithm 1. The algorithm takes as inputs the channel values, and produces the hard decision estimates $\hat{x}$. After the initialization step, the decoder runs for a maximum of $\text{It}_{max}$ iterations, and each iteration processes the block-columns sequentially, in arbitrary order. During each block-column processing, the computation of the messages and the update of the CNSs are organized in three steps: (i) the check-to-variable message generation with CNU-step-A, (ii) the variable-to-check message computation with VNU-step, and finally (iii) the CNS update with CNU-step-B. Depending on the particular implementation of the algorithm and the type of variable node update $\Phi_v$, the initialization step and the VNU-step can change. For example, if FAID algorithm is used in the VL decoder, the initialization is performed with the direct channel outputs y, while if a min-sum algorithm is used in the VL decoder, the initialization is performed with the LLRs.

In order to compute the hard decision estimates $\{\hat{x}_n\}_{1 \leq n \leq N}$, one needs to compute the APP from (8) using the messages $\mu_{c_m,v_n}$ generated during CNU-Step-A, and take a decision using equation (9). If the hard decision estimates verify the zero syndrome condition (10), then they form a valid codeword. The APP values can be computed at the end of the $\text{It}_{max}$ iterations, or alternatively can be computed during the decoding process, at the end of each iteration or at the end of each block-column processing. In the case of the APP values being computed during decoding, the value of the syndrome $H\hat{x}$ can be used as an early stopping criterion. Whenever the syndrome is equal to 0, the decoder can be stopped since it has converged to a valid codeword.

The general VL decoder presented in Algorithm 1 has a very large computational and storage complexity, and a classical solution to reduce the complexity is to truncate the magnitude state MAC ($d_c$) to only a small number $\omega$ of the smallest magnitudes. The truncated CNS uses a truncated magnitude state, and is defined as:

$$CNS^{(\omega)}(c_m) = \{s_m; (\text{mag}_1, \text{index}_1), \ldots, (\text{mag}_k, \text{index}_k), \ldots, \quad (12)$$

$$(\text{mag}_\omega, \text{index}_\omega)\}$$

$$= \{s_m; MAG(\omega)\}$$

Reducing the number of magnitudes in the CNS makes the VL decoder sub-optimal, impacting both the error correction strength and the decoding speed. It is commonly stated in the literature that keeping $\omega = 3$ magnitudes is sufficient to ensure a small

---

Algorithm 1: General VL iterative decoding

Input: Channel Values
Output: Hard Decision Estimates $\{\hat{x}_n\}_{1 \leq n \leq N}$
Initialization: initialize the messages $\{\mu_{v_n,c_m}\}$ with the channel values and compute the CNS from the initialized messages,
for iter = 1 to $\text{It}_{max}$ do
    for j = 1 to $N_b$ do
        CNU-Step-A: Message Generation

| Algorithm 1: General VL iterative decoding |
|---|
| for each variable node $v_n$ in block-column j, |
|   for each check node $c_m$ connected to variable node $v_n$ |
|     read the check node state $CNS(c_m) = \{s_m; MAG(d_c)\}$ |
|     (a) compute the temporary extrinsic sign: $\tilde{s} = s_m \cdot sign_{m,n}$ |
|     (b) compute the input messages to the VNU: $\mu_{c_m,v_n} = \tilde{s} \cdot mag_1$ |
|     if $index_1 \neq j$; and $\mu_{c_m,v_n} = \tilde{s} \cdot mag_2$ if $index_1 = j$ |
| VNU-Step: for each variable node $v_n$ in block-column j, |
|   (c) compute the outputs of VNU $\mu_{v_n,c_m}$ from the input |
|   messages $\mu_{c_m,v_n}$ and the channel values, using the variable node |
|   update function $\Phi_v$ |
| CNU-Step-B: CNS Update |
| for each variable node $v_n$ in block-column j, |
|   for each check node $c_m$ connected to variable node $v_n$, |
|     read the check node state $CNS(c_m) = \{s_m; MAG(d_c)\}$ |
|     (d) compute the temporary extrinsic sign: $\tilde{s} = s_m \cdot sign_{m,n}$ |
|     (e) compute $mag^* = |\mu_{v_n,c_m}|$ and set $index^* = j$ |
|     compute the new check node state CNS $(c_m)$: |
|     (f) $s_m = \tilde{s} \cdot sign(\mu_{v_n,c_m})$ |
|     (g) remove $(mag_k, index_k)$ corresponding to $index_k = j$ from |
|     the sorted list MAG $(d_c)$ |
|     (h) insert $(mag^*, index^*)$ in the sorted list MAG $(d_c)$ | enough error correction performance loss, without significantly impacting the average number of iterations.

The truncated CNS is used in the CNU-Step-A and CNU-Step-B in Algorithm 1 to reduce the decoding complexity. In the CNU-step-A, only the two smallest magnitudes in the CNS are used for the processing. Therefore, the truncation of the magnitude state does not change the CNU-step-A as long as $\omega \geq 2$. The CNU-step-B is impacted by the truncation of the CNS. We describe, in Algorithm 2, the simplified VL decoder when a truncated CNS is used in the case of $\omega \geq 2$. There are several ways to efficiently implement the CNU-Step-B in Algorithm 2 to optimize the computational complexity and minimize the impact of the error correction performance.

This invention relates to the simplification and the optimization of the low complexity implementation of CNU-Step-A and CNU-Step-B in VL decoders, while using a minimum number of magnitude states in the CNS.

| Algorithm 2: Simplified VL iterative decoding |
|---|
| Input: Channel Values |
| Output: Hard Decision Estimates $\{\hat{x}_n\}_{1 \leq n \leq N}$ |
| Initialization: initialize the messages $\{\mu_{v_n,c_m}\}$ with the channel values, and |
| compute the CNS from the initialized messages, |
| for iter = 1 to $It_{max}$ do |
|   for j = 1 to $N_b$ do |
|     CNU-Step-A: Message Generation |
|       same as in Algorithm 1 |
|     VNU-Step: |
|       same as in Algorithm 1 |
|     CNU-Step-B: CNS Update |
|     for each variable node $v_n$ in block-column j, |
|       for each check node $c_m$ connected to variable node $v_n$, |
|         read the check node state $CNS(c_m) = \{s_m; MAG(w)\}$ |
|         (d) compute the temporary extrinsic sign: $\tilde{s} = s_m \cdot sign_{m,n}$ |
|         (e) compute $mag^* = |\mu_{v_n,c_m}|$ and set $index^* = j$ |
|         compute the new check node state CNS(cm): |
|         (f) $s_m = \tilde{s} \cdot sign(\mu_{v_n,c_m})$ |
|         (g) if $index_k$ in the truncated list MAG (w) is equal to $index^*$, |
|         remove $(mag_k, index_k)$ from the list |
|         (h) insert $(mag^*, index^*)$ in the sorted truncated list MAG (w) |
|         and truncate it to w values. |

SUMMARY OF THE INVENTION

The present invention relates to decoding QC-LDPC codes using an iterative message passing algorithm. More specifically it relates to decoders following a vertical layered (VL) scheduling scheme.

The present invention relates to a method and apparatus to implement VL LDPC decoders targeting very low implementation complexity. This is achieved by simplifying the equations of the check-node update during iterative processing, and by reducing the amount of memory required for storing the relevant information about the messages exchanged between the variable nodes and the check nodes.

The algorithm of the present invention exchanges messages between the VNs and the CNs in the Tanner Graph of the LDPC code, updating the messages with variable node update (VNU) processing and check node update (CNU) processing. The smallest magnitudes and associated indices of the messages are stored in check node states (CNSs) within a check node memory (CNM). The CNU is implemented in two steps: the CNU-Generator step and the CNU-Updater step.

The method of the present invention simplifies the CNU-Generator and the CNU-Updater processing steps, while reducing the size of the CNM, with the objective of minimizing the resource usage of the VL decoder implementation, and reduce its computational complexity.

The method of the present invention implements the closest approximation of the CNU that would use a CNS with $\omega+1$ magnitudes, while using only values available from a CNS with w magnitudes. The additional magnitude is generated from the $\omega$ magnitudes available in a CNS, using a predictive magnitude map (PMM) function.

The apparatus of the present invention implements modifications to the CNU-Generator and to the CNU-Updater units to generate an additional magnitude using the PMM functions. The modified units, denoted PMM-CNU-Generator and PMM-CNU-Updater integrate the PMM additional magnitude into the CNU equations. When the decoding algorithm uses the PMM additional magnitude, it is denoted PMM-VL decoder.

In a preferred embodiment of the present invention, the CNS is limited to its minimum configuration, composed of only the smallest magnitude and its corresponding index, and the PMM function is designed to predict the value of a second smallest magnitude. The CNU-Generator and CNU-Updater are designed to make use of the predicted second smallest magnitude for their processing.

In another preferred embodiment of the present invention, the CNS contains the two smallest magnitudes and their corresponding indices, and the PMM function is designed to predict the value of a third smallest magnitude. The CNU-Generator and CNU-Updater are designed to make use of the predicted third smallest magnitude for their processing.

Additionally, in some embodiments, the method of the present invention uses a plurality of PMM functions in order to improve decoding performance. Switching between different PMM functions can be done at any time during the decoding process, based on the value of the block-column index or based on the iteration number. Alternatively, switching between different PMM functions can be done whenever some constraint is satisfied. Such constraint can involve, for example, counting the number of unsatisfied syndrome bits, and comparing this number to a threshold.

It will be seen in the detailed description that the objects set forth above are efficiently attained and, because some changes can be made in carrying out the proposed method without departing from the spirit and scope of the invention, it is intended that all matter contained in the description and shown in the accompanying drawings shall be interpreted as illustrative and not in a limiting sense.

BRIEF DESCRIPTION OF THE DRAWINGS

For a more complete understanding of the invention, reference is made to the following description and accompanying drawings, in which.

DETAILED DESCRIPTION OF THE INVENTION

Figure 1:
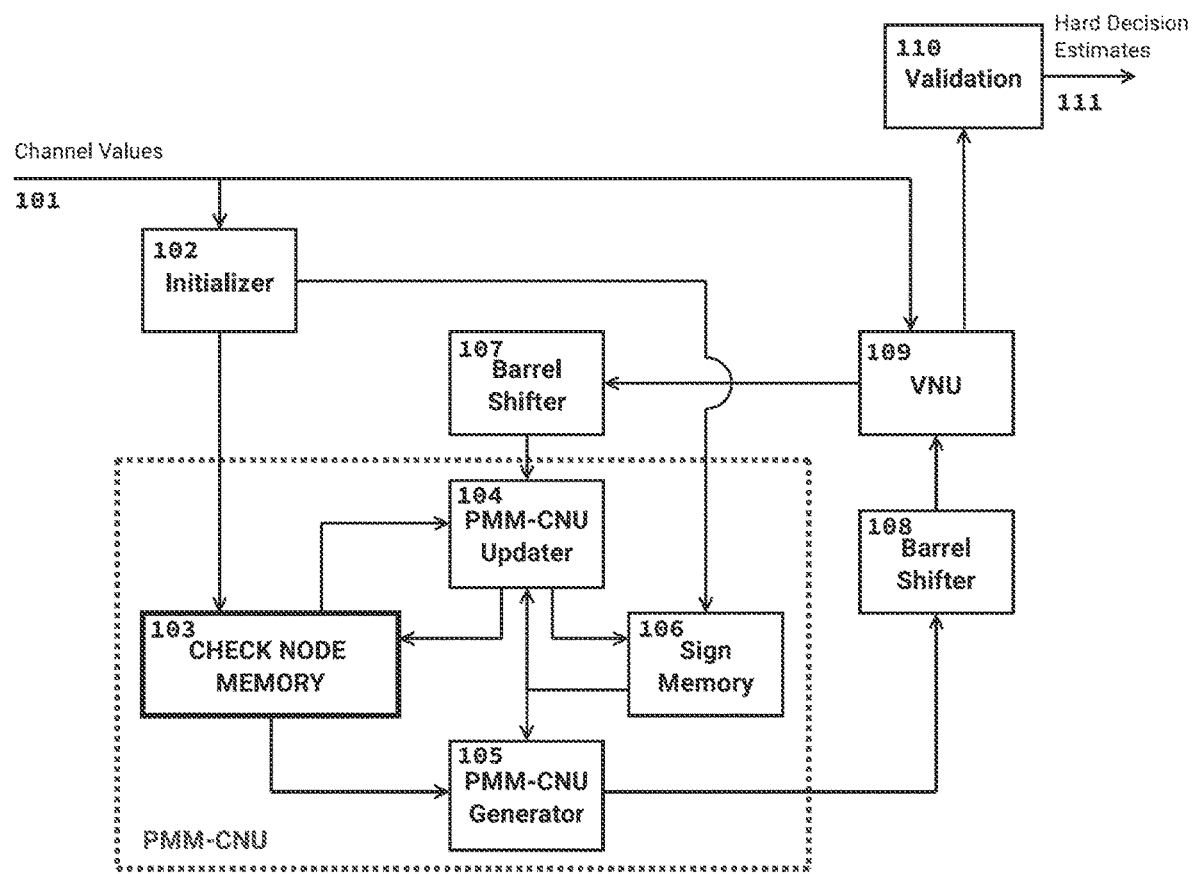
FIG. 1 shows the top level architecture of a PMM-VL decoder showing the proposed PMM-CNU module. The two units that use the predictive magnitude maps, as part of this invention, are the PMM-CNU-Generator and the PMM-CNU-Updater.

The method of the present invention relates to an iterative message-passing LDPC decoder operating on QC-LDPC codes, whose parity-check matrix consists of circulant permutation matrices (CPMs) of size L×L. The parity-check matrix is configured to have $N_b$ block-columns and $M_b$ block-rows. The j-th block-column contains $d_v(j)$ CPMs, and the i-th block-row contains $d_c(i)$ CPMs. In the rest of the description, we will drop the indices i and j in these notations. Nonetheless, all embodiments of the present invention apply both for regular and irregular LDPC codes.

The message-passing decoder of the present invention follows the VL scheduling, exchanging messages between the VNU module and the CNU module. The messages passing from the VNU module to the CNU module are named variable-to-check messages, denoted $\mu_{v_n,c_m}$, and the messages passing from the CNU module to the VNU module are named check-to-variable messages, denoted $\mu_{c_m,v_n}$. The messages $\mu_{v_n,c_m}$ and $\mu_{c_m,v_n}$ are associated to the edge in the Tanner Graph of the LDPC code connecting VN $v_n$ and CN $c_m$. In preferred embodiments of the present invention, the messages are represented using a fixed, typically small, number of precision bits, denoted $n_s$. The messages belong to a finite alphabet $\mathcal{M}$, as described in the background.

In various preferred embodiments of the method of the present invention, the VL decoder processes the $N_b$ block-columns of the QC-LDPC code in an arbitrary order, during a decoding iteration. We assume without loss of generality that the block-columns are processed sequentially from index j=1 to index j=$N_b$. During a decoding iteration, the current block-column will be denoted as the processed block-column. Furthermore, each block-column is composed of L variable nodes. When the decoder operates the VNU of a VN $v_n$ within the processed block-column, $v_n$ will be denoted as a processed VN. Finally, when the decoder operates the CNU of a check-node $c_m$ connected to a processed VN, $c_m$ will be denoted as processed CN.

In other preferred embodiments of the method, the VL decoder performs the processing of a plurality of block-columns, each of them composed of L variable nodes. Although for purposes of exposition, the method is described assuming the processing of a single processed block-column, the skilled in the art could easily generalize the method to a plurality of processed block-columns.

As described in the background, the VL decoder requires the use of several smallest magnitudes, denoted $mag_k$, and their corresponding block-column indices, denoted $index_k$, which are stored in the CNM.

In this invention, we propose to simplify the CNU processing (CNU-Step-A and CNU-Step-B) and reduce the size of the CNM, with the objective of reducing the resource usage of the VL decoder implementation, and minimizing its computational complexity. The proposed method implements the closest approximation of the CNU that would use a CNS with MAG(ω+1), but using only values available in a CNS with MAG(ω).

In order to describe the method, let us first assume that the CNS is composed of ω magnitude pairs:

$$CNS^{(\omega)}(c_m) = \{s_m; MAG(\omega)\} \quad (13)$$
$$= \{s_m; (mag_1, index_1), \ldots, (mag_k, index_k), \ldots, (mag_\omega, index_\omega)\}$$

We equip the CNU module in the decoder with a function $\chi_\omega$ which maps the ω magnitudes of the CNS into an additional magnitude:

$$\widetilde{mag}_{\omega+1} = \chi_\omega(mag_1, \ldots, mag_\omega) \quad (14)$$

We will call this function predictive magnitude map (PMM) throughout the description. The PMM could be any linear or non-linear mapping function from $\mathcal{M}^\omega$ to $\mathcal{M}$.

Although described in a very general manner, the proposed method is of special interest for small values of ω. In preferred embodiments of this invention, the PMM is defined for the following cases:

$\widetilde{mag}_2 = \chi_1(mag_1)$

In this minimum configuration, the CNM stores, for each check node, a CNS composed only of three values: (i) the value of the syndrome bit $s_m$, (ii) the smallest magnitude $mag_1$ of the incoming variable-to-check messages, and (iii) the edge index $index_1$ corresponding to the smallest magnitude. In this preferred embodiment, we aim at getting decoding performance close to a decoder using $CNS^{(2)}(c_m)$, but using only values from $CNS^{(1)}(c_m)$. Exemplary, non-limiting, PMM functions for this embodiment are given by:

$$\widetilde{mag}_2 = \min(mag_1+a,s) \quad a=0, \ldots, s \quad (15)$$

where s is the maximum magnitude in the message alphabet.

$\widetilde{mag}_3 = \chi_2(mag_1, mag_2)$

In this second preferred embodiment, the CNS that is considered is $CNS^{(2)}(c_m) = \{s_m; (mag_1, index_1), (mag_2, index_2)\}$, and the value of $\widetilde{mag}_3$ is predicted from the two smallest magnitudes, in order to approach the performance of a decoder with $CNS^{(3)}(c_m)$. Note that in this second preferred embodiment, there exist a larger number of PMM functions. $\chi_2$ could be a function of $mag_1$ only, of $mag_2$ only or of both $mag_1$ and $mag_2$.

By definition of the magnitude state which is a sorted list, we must have $\overline{mag}_{\omega,\omega+1} \geq mag_\omega$. In preferred embodiments of the invention, we will further assume that $\overline{mag}_{\omega,\omega+1} > mag_\omega$.

The VL decoder that is proposed in this invention uses the PMM additional magnitude in the CNU processing, and is referred to as PMM-VL decoder. For a PMM-VL decoder, the two steps of the CNU presented in Algorithm 2 are replaced with a PMM-CNU with a PMM-CNU-Step-A for the check-to-variable message generation, and with a PMM-CNU-Step-B for the CNS update. The main steps of the PMM-VL decoder are described in Algorithm 3.

---

Algorithm 3: PMM-VL iterative decoding

Input: Channel Values
Output: Hard Decision Estimates $\{\hat{x}_n\}_{1 \leq n \leq N}$
Initialization: same as in Algorithm 1
for iter = 1 to $It_{max}$ do
   for j = 1 to $N_b$ do
      PMM-CNU-Step-A: Message Generation
         described in Table 1
      VNU-Step:
         same as in Algorithm 1
      PMM-CNU-Step-B: CNS Update
         described in Table 2

---

An apparatus for the top level architecture of the PMM-VL decoder proposed in this invention is depicted in FIG. 1. This architecture, and especially the PMM-CNU module, is primarily designed around the Check Node Memory (CNM) 103, which stores the check node states $CNS(c_m)$ for all check nodes in the LDPC code. Each $CNS(c_m)$ is composed of the syndrome bit, $s_m$, the corresponding check node, and the magnitude state $MAG(\omega)$, which contains $\omega$ pairs of ($mag_k$, $index_k$). The sign memory 106 stores the signs $sign_{m,n}$ of the variable-to-check messages $\mu_{v_n,c_m}$. Consequently, there is one sign for each edge connecting a VN to a CN.

One can refer to the high-level description of a PMM-VL decoder in Table 3 for relating the decoding steps to the architecture units presented in FIG. 1.

For ease of exposition, we now describe the functioning of the modules assuming the processing of a single processed block-column. However, the description of the modules are also applicable to the more general case of processing a plurality of processed block-columns.

The initializer unit 102 takes the channel values 101, or any transformation of the channel values as inputs, and uses them to initialize the CNSs in the CNM 103. It computes the initial syndrome bits for all CNs, and the initial values of the magnitude states, which depend only on the magnitudes of the channel values or of their transformation. Alternatively, the initial magnitude states could be set by the initializer unit to fixed, predetermined values. After the initialization is performed, the CNM contains the initial values of the CNSs. The initializer unit also computes the initial values of the variable-to-check message signs, which are stored in the sign memory 106.

The PMM-CNU module is composed of two processing units: the PMM-CNU-Generator 105, which implements the message generation of PMM-CNU-Step-A, and the PMM-CNU-Updater 104, which implements the CNS update of PMM-CNU-Step-B. After initialization, the PMM-CNU module and the VNU module exchange messages iteratively, flowing through the Barrel Shifter units 107 and 108. The barrel shifters re-order the messages addresses according to the circulant permutation matrices of the QC-LDPC code.

For a processed block-column of degree $d_v$, the decoder proceeds as follows for each processed VN $v_n$ in the block-column. For each processed CN connected to $v_n$, the PMM-CNU-Generator 105 reads the CNS from the CNM and the message sign from the sign memory 106, computes the PMM additional magnitude, and generates the check-to-variable messages $\mu_{c_m,v_n}$ that will serve as inputs to the VNU module. For each processed VN, there are $d_v$ check-to-variable messages that need to be generated. After processing all VNs in the processed block-column, the messages are then cyclically shifted by the barrel shifter unit 108 according to the $d_v$ CPMs of the processed block-column.

For each processed VN in the processed block-column, the VNU module 109 receives $d_v$ check-to-variable messages and the channel value corresponding to the processed VN. The VNU module computes $d_v$ variable-to-check messages $\mu_{v_n,c_m}$ using the variable node update function $\Phi_v$, according to equation (5). Once all VNs in the processed block-column have been processed, the messages are cyclically shifted by the barrel shifter unit 107 and sent to the PMM-CNU-Updater 104.

For each processed CN, the PMM-CNU-Updater takes as inputs the corresponding variable-to-check message from 107, its associated CNS from 103 and the corresponding sign from 106. Note that the sign $sign_{m,n}$ coming from the sign memory is the sign of the corresponding variable-to-check message $\mu_{v_n,c_m}$, but from the previous decoding iteration. Then, the PMM-CNU-Updater computes the PMM additional magnitude, updates the new CNS for the processed CN which is written in the CNM 103, and extracts the new sign of the message $\mu_{v_n,c_m}$ which is written in the sign memory 106.

The computation and update of messages and CNSs described previously is repeated until the entire parity-check matrix has been traversed which then constitutes one decoding iteration, and then the decoding process restarts again from the first block-column to begin the next decoding iteration.

The VNU module also computes the APP following (8) for all VNs in the processed block-column and computes hard-decision estimates $\hat{x}$. The hard decision estimates are sent to the validation unit 110 to check if the decoder has converged to a codeword. The validation unit computes the syndrome of the LDPC code with the most recent values of $\hat{x}$ received from the VNU module, and stops the decoding whenever the syndrome is zero, following equation (10), meaning that the hard-decision estimates $\hat{x}$ 111 form a valid codeword. Both the computation of the APP and the validation of the syndrome can be performed at any time during the decoding process, at the end of the processing of a block-column.

The CNU-Generator computes the incoming messages to the VNU module using the CNM and the sign memory. A CNU-Generator that uses the PMM functions is referred to as PMM-CNU-Generator and implements the PMM-CNU-Step-A of Algorithm 3.

From the description in Algorithm 1, it can be seen that the CNU-Generator requires only the following values from $MAG(\omega)$: ($mag_1$, $index_1$, $mag_2$). As a result, this module does not require much modification to incorporate the use of the PMM function. When $MAG(\omega)$ with $\omega \geq 2$ is used in a PMM-CNU-Generator, no change in the algorithm is required. When MAG($\omega$) with $\omega=1$ is used in a PMM-CNU-Generator, then $\widetilde{mag}_2$ is computed from the PMM function $\chi_1$, and used in PMM-CNU-Step-A, as described in Table 1.

TABLE 1

PMM-CNU-Generator processing: case of w = 1

Figure 2:
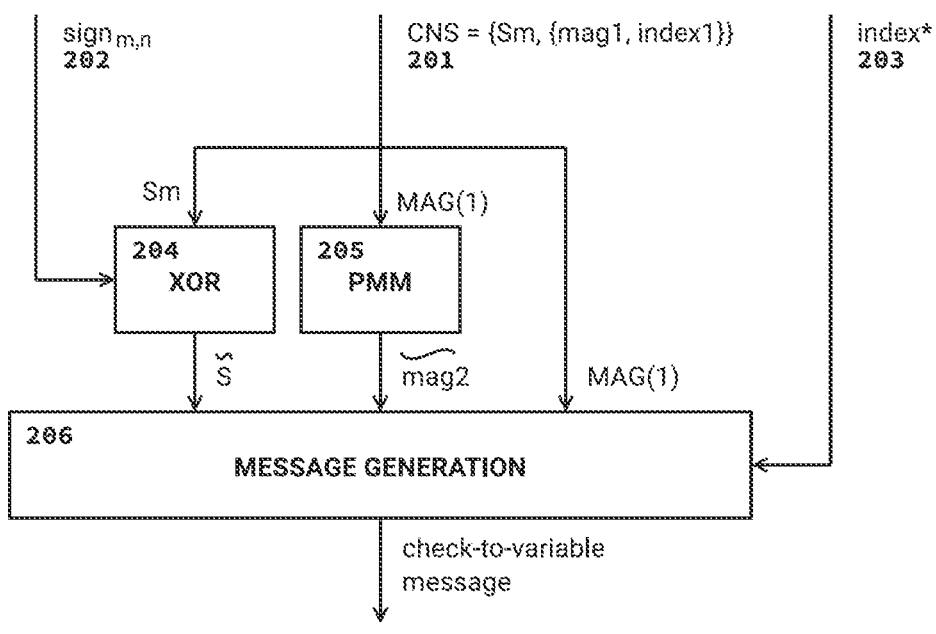
FIG. 2 shows a preferred embodiment for the architecture of a PMM-CNU-Generator unit, in the case of a check node state with only ω=1 magnitude pair.

PMM-CNU-Step-A: Message Generation
for each variable node $v_n$ in block-column j,
for each check node $c_m$ connected to variable node $v_n$
read the check node state $CNS^{(1)}(c_m) = \{s_m; MAG(1)\}$
  (a) compute the temporary extrinsic sign: $\tilde{s} = s_m \cdot sign_{m,n}$
  (b) compute the PMM additional magnitude: $\widetilde{mag}_2 = \chi_1 (mag_1)$
  (c) compute the input messages to the VNU: $\mu_{c_m,v_n} = \tilde{s} \cdot mag_1$ if $index_1 \neq j$; and $\mu_{c_m,v_n} = \tilde{s} \cdot \widetilde{mag}_2$ if $index_1 = j$ In FIG. 2, we show the architecture of the apparatus implementing the PMM-CNU-Generator, which computes the incoming check-to-variable messages to the VNU module, in the case of $\omega=1$.

For each of the $d_v$ processed CNs $c_m$ connected to the processed VN $v_n$ in the processed block-column index*=j 203, the corresponding CNS 201 is read from the CNM, and the corresponding sign 202 is read from the sign memory. Since $\omega=1$, the CNS is composed only of the syndrome bit $s_m$ and a single pair $MAG(1)=(mag_1, index_1)$. An XOR operation is performed between the syndrome bit and the message sign $sign_{m,n}$ in unit 204 to compute the temporary extrinsic sign $\tilde{s}$. The PMM unit 205 computes the predicted value of $\widetilde{mag}_2$ from MAG(1), using function $\chi_1$. The message generation unit 206 implements the step PMM-CNU-Step-A-(c) of Table 1. At the output of unit 206, we get the check-to-variable message $\mu_{c_m,v_n}$ which serves as input to the VNU.

In the case of $\omega \geq 2$, the PMM unit 205 is bypassed and the message generation unit 206 takes only the CNS values, the temporary extrinsic sign $\tilde{s}$, and the processed block-column index as inputs.

At the output of the CNU-Generator, and for each processed VN in the processed block-column, $d_v$ check-to-variable messages are sent to the VNU module to compute the variable-to-check messages $\mu_{v_n,c_m}$ that will serve as inputs to the CNU-Updater.

In a preferred embodiment of the present invention, the VNU update function is defined as a low precision function $\Phi_v$, corresponding to the FAID algorithm as described in the background. Numerous embodiments of the VNU update function $\Phi_v$ are within the scope of this invention where $\Phi_v$ can be defined as a closed-form function, a look-up table, an arbitrary map, a set of equations, or any other applicable finite precision update function. The messages are represented in $n_s$ bits of precision, and the VNU update function will be referred to as a $n_s$-bits FAID update function, which can be applied indifferently to hard output channels, or any $n_q$-bits soft input channel.

In other preferred embodiments of the present invention, the VNU module can use multiple VNU update functions $\{\Phi_v^{(1)}, \ldots, \Phi_v^{(d)}\}$ for the computation of the variable-to-check messages, in order to improve the error correction performance of the decoder. For example, different VNU update functions can be used for different block-column processing.

For each processed VN $v_n$ in the processed block-column, composed of $d_v$ circulants, the CNU-Updater computes new values of the CNS for the $d_v$ processed CNs connected to $v_n$. A CNU-Updater that uses the PMM functions is referred to as PMM-CNU-Updater and implements the PMM-CNU-Step-B of Algorithm 3.

The PMM-CNU-Updater described in Table 2 differs from the CNU-Updater of the classical VL decoder in steps (f) and (i). From the magnitudes stored in MAG($\omega$) of a CNS, the PMM function $\chi_\omega$ computes an additional magnitude $\widetilde{mag}_{\omega,\omega+1}$, which forms a additional magnitude pair together with the current block-column index: ($\widetilde{mag}_{\omega,\omega+1}$, index*). On top of the new magnitude pair (mag*, index*), the PMM additional pair is also considered in the sorted list before truncation, in step (i).

TABLE 2

PMM-CNU-Updater processing

PMM-CNU-Step-B: CNS Update
for each variable node $v_n$ in block-column j,
for each check node $c_m$ connected to variable node $v_n$,
read the check node state $CNS(c_m) = \{s_m; MAG(w)\}$
  (d) compute the temporary extrinsic sign: $\tilde{s} = s_m \cdot sign_{m,n}$
  (e) compute mag* = $|\mu_{v_n,c_m}|$ and set index* = j
  (f) compute the PMM additional magnitude:
    $\widetilde{mag}_{\omega+1} = \chi_w (mag_1, \ldots, mag_w)$
compute the new check node state $CNS(c_m)$:
  (g) $s_m = \tilde{s} \cdot sign (\mu_{v_n,c_m})$
  (h) if $index_k$ in the truncated list MAG (w) is equal to index*, remove ($mag_k$, $index_k$) from the list
  (i) insert (mag*, index*) and the additional PMM pair ($\widetilde{mag}_{\omega+1}$, index*) in the sorted list and truncate it to w values.

Figure 3:
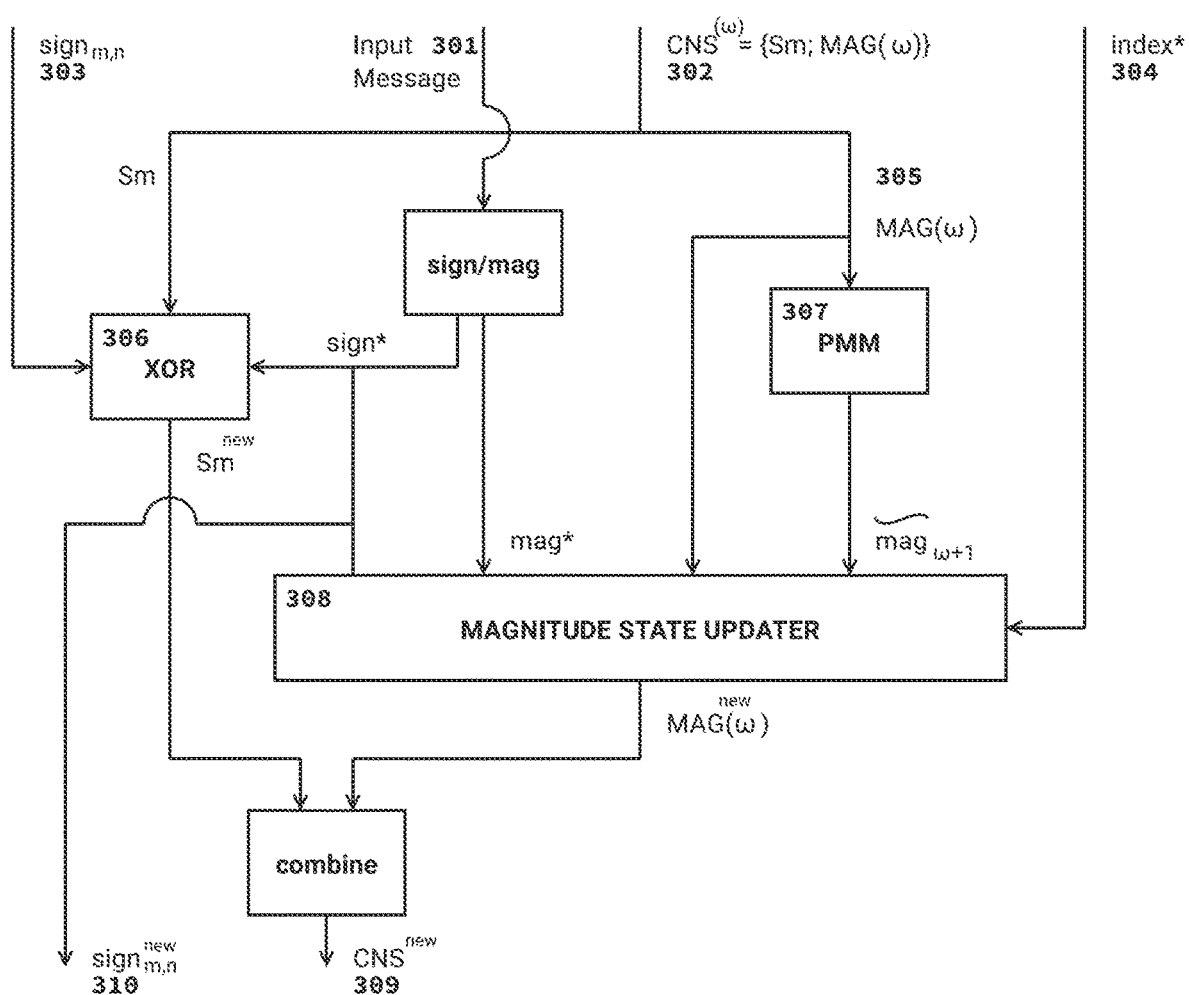
FIG. 3 shows a preferred embodiment for the architecture of a PMM-CNU-Updater unit, in the general case of a check node state with ω magnitude pairs.

In FIG. 3 we show the architecture of the apparatus implementing the PMM-CNU-Updater, which updates the CNS stored in the CNM, for the general case of $\omega$ magnitude states.

For a processed VN $v_n$ in a given processed block-column index*=j 304 and for each processed CN $c_m$ connected to $v_n$, the PMM-CNU-Updater takes as inputs the new variable-to-check message $\mu_{v_n,c_m}$ 301 that has been generated by the VNU module, the corresponding sign $sign_{m,n}$ 303 from the previous iteration, and the old CNS for $c_m$ 302. The CNS is composed of the syndrome bit $s_m$ and $\omega$ pairs ($mag_k$, $index_k$) in the magnitude state, MAG($\omega$).

The sign and magnitude of the new variable-to-check message 301 are extracted, i.e. mag*=$|\mu_{v_n,c_m}|$ and sign*=sign ($\mu_{v_n,c_m}$). The value sign* corresponds to the new sign $sign_{m,n}^{new}$ 310 to be stored in the sign memory 101. The updated syndrome bit $s_m^{new}$ is obtained using a 3-input XOR unit 306 which performs an XOR operation of the old syndrome bit $s_m$ with the old sign $sign_{m,n}$, and with the sign of the new input message sign*.

The PMM unit 307 computes the value of $\widetilde{mag}_{\omega,\omega+1}$ from the magnitudes in MAG($\omega$), using the PMM function $\chi_\omega$.

For each processed CN, the Magnitude State Updater unit 308 computes the updated magnitude state $MAG^{new}(\omega)$. It receives as inputs the magnitude of the input message mag*, the old magnitude state MAG($\omega$), the PMM additional magnitude $\widetilde{mag}_{\omega,\omega+1}$, and the index of the processed block-column index*=j.

The Magnitude State Updater proceeds as follows. First, the unit checks if the current index index* is present in the old magnitude state MAG($\omega$), and removes the corresponding pair ($mag_k$, $index_k$). If index* does not appear in MAG ($\omega$), no pair is removed. Then, we associate the current block-column index to the PMM additional magnitude to form a PMM pair ($\widetilde{mag}_{\omega,\omega+1}$, index*). The PMM pair and the newly generated pair (mag*, index*) are inserted in the sorted list to compute the new magnitude state, $MAG^{new}(\Omega)$. At this stage of the processing, the size of the magnitude state is either $\Omega=\omega+1$ or $\Omega=\omega+2$, depending on whether a pair ($mag_k$, $index_k$) has been removed from the old magnitude state or not. The sorted magnitude state $MAG^{new}(\Omega)$ is truncated to the smallest w magnitudes, in order to form the updated magnitude state $MAG^{new}(\omega)$.

Finally, the updated syndrome bit and the updated magnitude state are combined into the new check node state 309, which is sent and written to the CNM.

For the preferred embodiment of $\omega=1$, the Magnitude State Updater 308 computes the new magnitude state according to the following rules:

If(index*=index$_1$)&(mag*≤ $\widetilde{mag}_2$)⇒$MAG^{new}(1)$= (mag*,index*)

If(index*=index$_1$)&(mag*> $\widetilde{mag}_2$)⇒$MAG^{new}(1)$= ($\widetilde{mag}_2$,index*)

If(index*≠index$_1$)&(mag*≤mag$_1$)⇒$MAG^{new}(1)$= (mag*,index*)

If(index*≠index$_1$)&(mag*>mag$_1$)⇒$MAG^{new}(1)$= (mag$_1$,index$_1$)

For the preferred embodiment of $\omega=2$, the Magnitude State Updater 308 computes the new magnitude state according to the following rules:

If(index*=index$_1$)&(mag*≤mag$_2$)⇒$MAG^{new}(2)$= {(mag*,index*),(mag$_2$,index$_2$)}

If(index*=index$_1$)&(mag*>mag$_2$)&(mag*≤ $\widetilde{mag}_3$)⇒$MAG^{new}(2)$={(mag$_2$,index$_2$),(mag*,index*)}

If(index*=index$_1$)&(mag*> $\widetilde{mag}_3$)⇒$MAG^{new}(2)$= {(mag$_2$,index$_2$),($\widetilde{mag}_3$,index*)}

If(index*=index$_2$)&(mag*≤mag$_1$)⇒$MAG^{new}(2)$= {(mag*,index*),(mag$_1$,index$_1$)}

If(index*=index$_2$)&(mag*>mag$_1$)&(mag*≤ $\widetilde{mag}_3$)⇒$MAG^{new}(2)$={(mag$_1$,index$_1$),(mag*,index*)}

If(index*=index$_2$)&(mag*> $\widetilde{mag}_3$)⇒$MAG^{new}(2)$= {(mag$_1$,index$_1$),($\widetilde{mag}_3$,index*)}

If(index*≠index$_1$)&(index*≠index$_2$)&(mag*≤ mag$_1$)⇒$MAG^{new}(2)$={(mag*,index*),(mag$_1$,index$_1$)}

If(index*≠index$_1$)&(index*≠index$_2$)&(mag*>mag$_1$)& (mag*≤mag$_2$)⇒$MAG^{new}(2)$={(mag$_1$,index$_1$), (mag*,index*)}

If(index*≠index$_1$)&(index*≠index$_2$)&(mag*> mag$_2$)⇒$MAG^{new}(2)$={(mag$_1$,index$_1$),(mag$_2$,index$_2$)}

As part of this invention, the PMM-VL decoder may also use a plurality of PMM functions in order to improve the error correction performance. For purposes of exposition, let us assume that for a magnitude state of size w, there are d PMM functions in the set $\{\chi_\omega^{(1)}, \ldots, \chi_\omega^{(d)}\}$ that are available to use.

The proposed method is based on the fact that a PMM-VL decoder that uses $\chi_\omega^{(k)}$ and a PMM-VL decoder that uses $\chi_\omega^{(k')}$ with k≠k' can have different iterative decoding dynamics, and therefore yield different decoding results. For example, some PMM functions could be more effective to correct the errors in the so-called waterfall region of the error rate performance of the LDPC code, while other PMM functions could be more efficient in the error floor region of the error rate performance of the LDPC code.

We propose to use the diversity of decoder dynamics brought by multiple different PMM functions to improve the overall error correction performance of a PPM-VL decoder. Such a decoder will be referred to as Multiple-PMM-VL decoder. There are several ways of switching between different PMM functions during decoding. We present, as examples, three preferred embodiments of the method that switches between different PMM functions during decoding in a Multiple-PMM-VL decoder. However, any other strategy of combining the outcomes of a plurality of PMM functions in a Multiple-PMM-VL decoder falls within the scope of this invention.

Static Switching: we refer to static switching as the case when the Multiple-PMM-VL decoder uses sequentially different PMM functions and re-initializes the decoding with the channel values each time the decoder switches to a new PMM function.

In this preferred embodiment, the Multiple-PMM-VL starts the decoding of PMM-VL using $\chi_\omega^{(1)}$, for a maximum of $It_{max}^{(1)}$ iterations. If the decoder has not converged to a valid codeword, then the decoding of PMM-VL is restarted with the same inputs but uses the next PMM function $\chi_\omega^{(2)}$, for a maximum of $It_{max}^{(2)}$ iterations. When the decoder is restarted, the channel values 101 are used as inputs, going through the Initializer unit 102, therefore initializing the CNM 103 and the sign memory 106 with the same values as in the beginning of the decoding. This process is repeated until decoding is successful, or all d PMM functions have been exhausted.

Dynamical Switching based on the block-column index and/or the iteration number: we refer to dynamical switching as the case when the Multiple-PMM-VL decoder can select dynamically a particular PMM function, among the d available functions, during decoding and at each block-column processing, according to some constraint or a particular value of a decoder parameter. In dynamical switching, the decoder does not restart with a new initialization, and proceeds with the decoding only modifying the PMM function.

Figure 4:
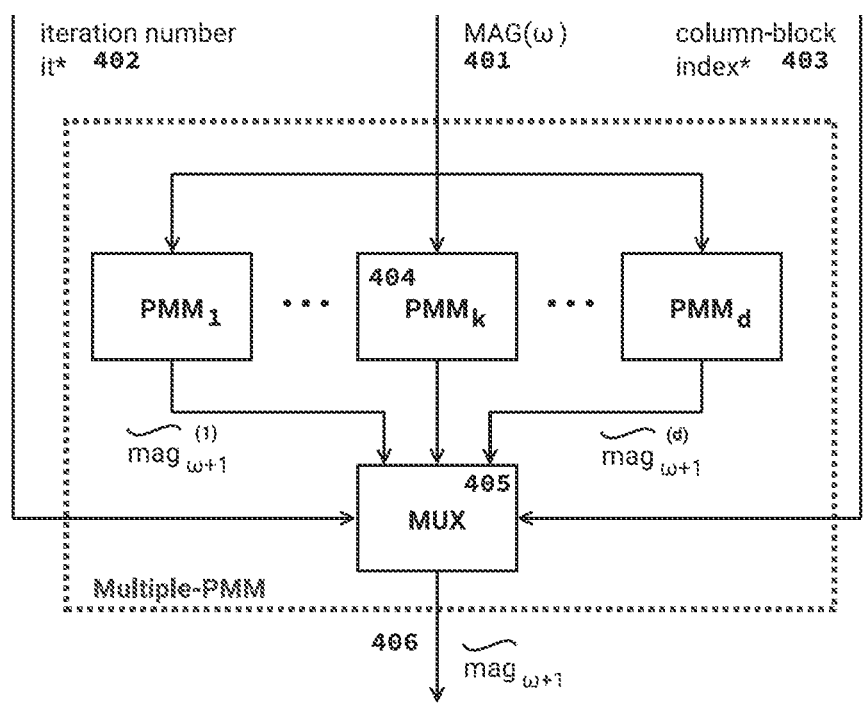
FIG. 4 shows a preferred embodiment for the architecture of a Multiple-PMM unit to be used in the PMM-CNU-Generator and the PMM-CNU-Updater, for dynamical PMM switching based on the iteration number and/or the block-column index.

In this second preferred embodiment, the Multiple-PMM-VL switches between different PMM functions based on the iteration number and/or the index of the block-column. In this embodiment, a list of D pre-determined values for the iteration numbers and for the block-column indices needs to be chosen. The iteration numbers are denoted $\{It^{(1)}, \ldots, It^{(D)}\}$, with $It^{(k)} \leq It^{(k+1)}$ and the block-column indices are denoted $\{index^{(1)}, \ldots, index^{(D)}\}$. Each pair of value $(It^{(k)}, index^{(k)})$ is associated with a particular PMM function PMM(k). The architecture of the apparatus which implements the Multiple-PMM selection unit is described in FIG. 4. The Multiple-PMM unit described in this figure replaces the PMM units, 205 in the PMM-CNU-Generator and 307 in the PMM-CNU-Updater. In this Multiple-PMM unit, the magnitudes in MAG($\omega$) are input in 401 and are used to generate the PMM additional magnitude 406, using one of the available PMM functions. During decoding, when $It^* = It^{(k)}$ and $index^* = index^{(k)}$, then the multiplexer 405 selects $PMM_k$ 404 to generate the PMM additional magnitude.

In the general case, the number of PMM functions d is allowed to be different than the number of switches D. For example, if D>d, the same PMM functions can be selected multiple times during the decoding process.

Dynamical Switching Based on Syndrome Weight.

Figure 5:
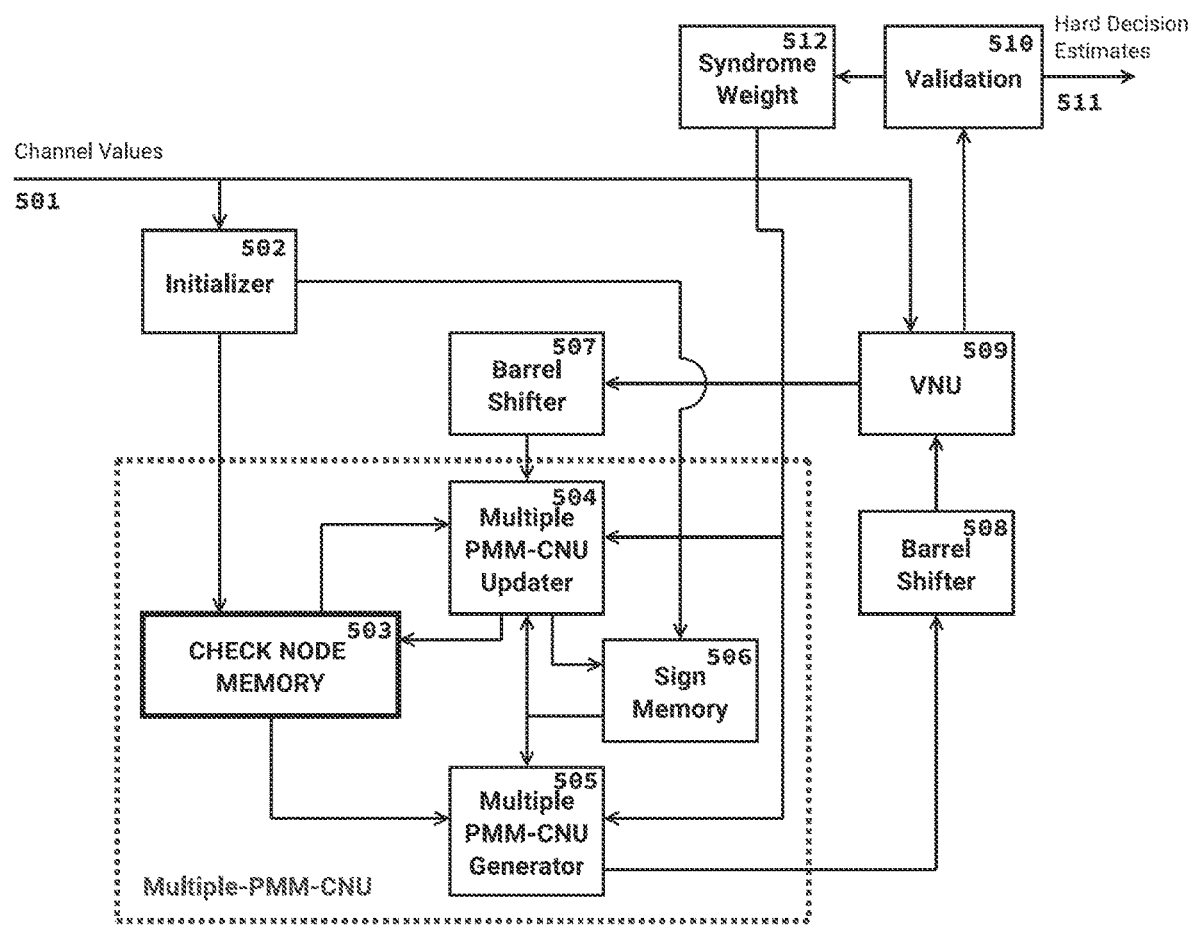
FIG. 5 shows the top Level architecture of a Multiple-PMM-VL decoder showing the proposed Multiple-PMM-CNU module, for dynamical PMM switching based on Syndrome weight.

In this third preferred embodiment, the Multiple-PMM-VL switches between different PMM functions based on the value of the syndrome weight, equal to the sum of all syndrome bits stored in the CNSs, i.e. $S_\omega = \sum_{m=1}^{M} s_m$. The architecture of this embodiment of the Multiple-PMM-VL decoder is shown in FIG. 5. The decoder is equipped with a syndrome weight computation unit 512 which uses, as inputs, the syndrome bits produced by the Validation unit 510. The value of the syndrome weight is sent to the Multiple-PMM-CNU modules 504 and 505.

Figure 6:
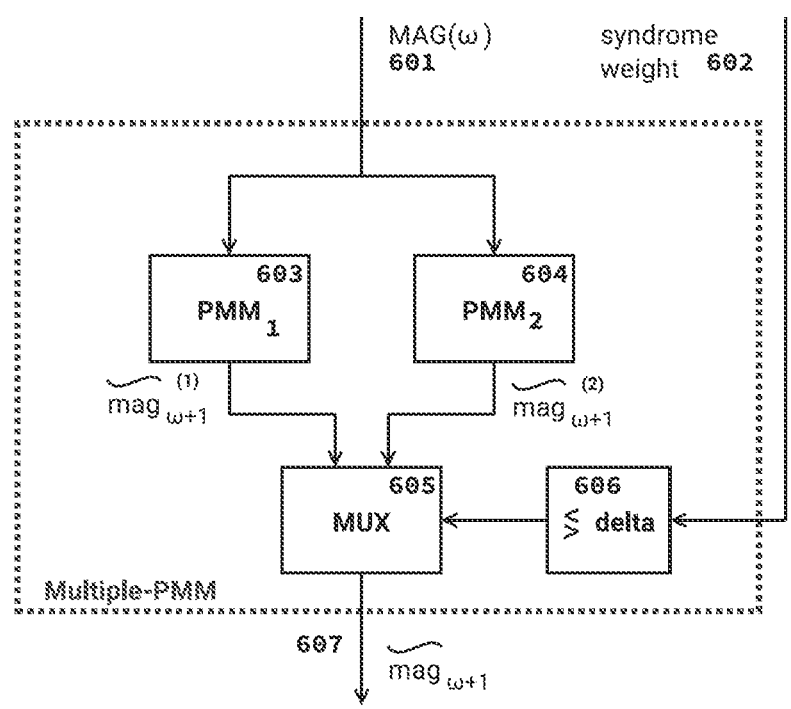
FIG. 6 shows a preferred embodiment for the architecture of a Multiple-PMM unit to be used in the PMM-CNU-Generator and the PMM-CNU-Updater, for dynamical PMM switching based on the syndrome weight.

The PMM units, 205 in the PMM-CNU-Generator and 307 in the PMM-CNU-Updater, are replaced with the Multiple-PMM unit described in FIG. 6. As an example, we describe the non-limiting case of d=2 PMM functions, and the generalization to a larger number of PMM functions follows easily. The decoding starts with the first PMM function 603, and the syndrome weight $S_\omega$ in 602 is monitored at each block-column processing. The decision to switch between the two PMM functions 603 and 604 is taken by comparing the syndrome weight to a fixed, predetermined threshold $\delta$, in unit 606. When the constraint $S_\omega \geq \delta$ is satisfied, $PMM_1$ is selected, and when the constraint $S_\omega < \delta$ is satisfied, then $PMM_2$ is selected. The generalization to d>2 PMM functions requires the use of d−1 predetermined thresholds $\{\delta^{(1)}, \ldots, \delta^{(d-1)}\}$.

Other possible embodiments of the Multiple-PMM-VL decoder include (i) using a combination of the iteration and block-column index together with the syndrome weight for taking the decision to switch to a different PMM functions, or (ii) using a different metric than S, for switching between different PMM functions, including metrics that combine the syndrome bits and the values of the magnitudes stored in the CNSs.

In other preferred embodiments of the Multiple-PMM-VL decoder, we consider also the use of multiple VNU update functions $\{\phi_\omega^{(1)}, \ldots, \phi_\omega^{(d)}\}$, which can be defined, without loss of generality, as finite precision FAID update functions. In these embodiments, each PMM function in the set $\{\chi_\omega^{(1)}, \ldots, \chi_\omega^{(d)}\}$ is associated to a VNU update function to form pairs of functions $(\phi_\omega^{(k)}, \chi_\omega^{(k)})$. Whenever the Multiple-PMM-VL decoder switches to a different PMM function, according to one of the switching strategies described previously, the new PMM function is used in the Multiple-PMM-CNU modules while the associated new VNU update function is used in the VNU module 509.

What is claimed:

1. A method for vertical layered decoding of quasi-cyclic low-density parity-check (LDPC) codes, the method comprising:
    receiving, as inputs, channel values belonging to a channel output alphabet;
    using the channel values for initializing and iteratively processing messages between variable nodes and check nodes within block-columns in an arbitrary order, and sequentially;
    initializing, during the initializing, check node states associated with the check nodes by computing syndrome bits and magnitudes of the check node states;
    computing, during the initializing, respective signs of variable-to-check messages;
    storing the check node states in a check node memory, with each check node state associated to a check node comprising a syndrome bit computed from the signs of the variable-to-check messages of the associated check node and a set of values comprising one or more smallest magnitudes of the variable-to-check messages of the associated check node, along with a same number of respective block-column indices;
    iteratively processing a group of the one or more block-columns, wherein the iterative processing includes:
        computing new check-to-variable messages with inputs comprising the check node states and the signs of the variable-to-check messages as inputs, wherein for each check node, the computation is performed using a check node update-generator (CNU-Generator) step that uses the magnitudes of the associated check node state and one or more additional magnitudes generated from the magnitudes of the associated check node state, by using one or more predictive magnitude maps;
        computing new variable-to-check messages with inputs comprising the channel values and the check-to-variable messages, using one or more variable node update functions; and
        updating the check node states to new values with inputs comprising the variable-to-check messages, wherein for each check node state, the updating is performed using a check node update-updater (CNU-Updater) step that uses the magnitudes of the associated check node state and one or more additional magnitudes generated from the magnitudes of the associated check node state by using one or more predictive magnitude maps;
    computing the syndrome bits from the hard decision estimates and checking whether the hard-decision estimates constitute a codeword; and
    outputting the codeword, in accordance with the hard-decision estimates constituting a codeword.

2. The method of claim 1, wherein:
    each check node state associated to a check node comprises the syndrome bit computed from the signs of the variable-to-check messages of the associated check node and a set of two smallest magnitudes of the variable-to-check messages of the associated check node along with their two respective block-column indices; and
    during the CNU-Updater step at each check node, the associated check node state is updated using the set of two smallest magnitudes of the associated check node state and a third magnitude generated from the set of two smallest magnitudes of the associated check node state by using a predictive magnitude map.

3. The method of claim 1, wherein:
    each check node state associated to a check node comprises the syndrome bit computed from the signs of the variable-to-check messages of the associated check node and a single smallest magnitude of the variable-to-check messages of the associated check node along with its respective block-column index;
    during the CNU-Updater step at each check node, the associated check node state is updated using the single magnitude of the associated check node state and a second magnitude generated from the single magnitude of the associated check node state by using a predictive magnitude map; and
    during the CNU-generator step at each check node, the new check-to-variable messages are computed using the single magnitude of the associated check node state and a second magnitude generated from the magnitude of the associated check node state by using a predictive magnitude map.

4. The method of claim 1, wherein:
    the iterative processing is performed sequentially in arbitrary order from one block-column to another block-column;
    each check node state associated to a check node comprises the syndrome bit computed from the signs of the variable-to-check messages of the associated check node and a set of two smallest magnitudes of the variable-to-check messages of the associated check node along with their two respective block-column indices;

during the CNU-Updater step at each check node, the associated check node state is updated using the two magnitudes of the associated check node state and a third magnitude that is selected from a plurality of magnitudes generated from the two magnitudes of the associated check node state by using a plurality of predictive magnitude maps; and the third magnitude is selected from a plurality of magnitudes for use in the CNU-Updater step based on the index of the block-column that is being processed.

5. The method of claim 1, further comprising computing the syndrome weight during the iterative processing of each group of one or more block-columns, and wherein:

each check node state associated to a check node comprises the syndrome bit computed from the signs of the variable-to-check messages of the associated check node and the set of two smallest magnitudes of the variable-to-check messages of the associated check node along with their two respective block-column indices;

during the CNU-Updater step at each check node, the associated check node state is updated using the set of two smallest magnitudes of the associated check node state and a third magnitude that is selected from a plurality of magnitudes generated from the set of two smallest magnitudes of the associated check node state by using a plurality of predictive magnitude maps; and the third magnitude is selected from a plurality of magnitudes for use in the CNU-Updater step based on the value of the syndrome weight.

6. The method of claim 1, wherein:

each check node state associated to a check node comprises the syndrome bit computed from the signs of the variable-to-check messages of the associated check node and a set of two smallest magnitudes of the variable-to-check messages of the associated check node along with their two respective block-column indices;

during the CNU-Updater step at a check node, the associated check node state is updated using the set of two smallest magnitudes of the associated check node state and a third magnitude that is selected from a plurality of magnitudes generated from the set of two smallest magnitudes of the associated check node state by using a plurality of predictive magnitude maps; and a third magnitude is selected from a plurality of magnitudes for use in the CNU-Updater step at a check node during the processing of a group of one or more block-columns, and a different third magnitude is selected from the plurality of magnitudes for use in the CNU-Updater step during the processing of another group of one or more block-columns.

7. The method of claim 1, wherein:

the iterative processing is performed sequentially in arbitrary order from one block-column to another block-column;

each check node state associated to a check node comprises the syndrome bit computed from the signs of the variable-to-check messages of the associated check node and a single smallest magnitude of the variable-to-check messages of the associated check node along with its respective block-column index;

during the CNU-Updater step at a check node, the associated check node state is updated using the single magnitude of the associated check node state and a second magnitude that is selected from a plurality of magnitudes generated from the single magnitude of the associated check node state by using a plurality of predictive magnitude maps;

the second magnitude is selected from a plurality of magnitudes for use in the CNU-Updater step based on the index of the block-column that is being processed;

during the CNU-Generator step at a check node, the new check-to-variable messages are computed using the single magnitude of the associated check node state and a second magnitude that is selected from a plurality of magnitudes generated from the single magnitude of the associated check node state by using a plurality of predictive magnitude maps; and the second magnitude is selected from a plurality of magnitudes for use in the CNU-Generator step based on the index of the block-column that is being processed.

8. The method of claim 1, further comprising computing the syndrome weight during the iterative processing of each group of one or more block-columns, and wherein:

each check node state associated to a check node comprises the syndrome bit computed from the signs of the variable-to-check messages of the associated check node and a single smallest magnitude of the variable-to-check messages of the associated check node along with its respective block-column index;

during the CNU-Updater step at a check node, the associated check node state is updated using the single magnitude of the associated check node state and a second magnitude that is selected from a plurality of magnitudes generated from the single magnitude of the associated check node state by using a plurality of predictive magnitude maps;

the second magnitude is selected from a plurality of magnitudes for use in the CNU-Updater step based on the syndrome weight;

during the CNU-Generator step at a check node, the new check-to-variable messages are computed using the single magnitude of the associated check node state and a second magnitude that is selected from a plurality of magnitudes generated from the single magnitude of the associated check node state by using a plurality of predictive magnitude maps; and the second magnitude is selected from a plurality of magnitudes for use in the CNU-Generator step based on the value of the syndrome weight.

9. The method of claim 1, wherein:

each check node state associated to a check node comprises the syndrome bit computed from the signs of the variable-to-check messages of the associated check node and a single smallest magnitude of the variable-to-check messages of the associated check node along with its respective block-column index;

during the CNU-Updater step at a check node, the associated check node state is updated using the single magnitude of the associated check node state and a second magnitude that is selected from a plurality of magnitudes generated from the single magnitude of the associated check node state by using a plurality of predictive magnitude maps;

a second magnitude is selected from a plurality of magnitudes for use in the CNU-Updater step at a check node during the processing of a group of one or more block-columns, and a different second magnitude is selected from the plurality of magnitudes for use in the CNU-Updater step during the processing of another group of one or more block columns;

during the CNU-Generator step at a check node, the new check-to-variable messages are computed using the single magnitude of the associated check node state and a second magnitude that is selected from a plurality of magnitudes generated from the single magnitude of the associated check node state by using a plurality of predictive magnitude maps; and a second magnitude is selected from a plurality of magnitudes for use in the CNU-Generator step at a check node during the processing of a group of one or more block-columns, and a different second magnitude is selected from the plurality of magnitudes for use in the CNU-Generator step during the processing of another group of one or more block-columns.

10. The method of claim 1, further comprising computing the syndrome weight during the iterative processing of each group of one or more block-columns, and wherein:

each check node state associated to a check node comprises the syndrome bit computed from the signs of the variable-to-check messages of the associated check node and a set of two smallest magnitudes of the variable-to-check messages of the associated check node along with their two respective block-column indices;

during the CNU-Updater step at a check node, the associated check node state is updated using the two magnitudes of the associated check node state and a third magnitude that is selected from two values generated from the two magnitudes of the associated check node state by using two different predictive magnitude maps; and the first value of the two values is selected as the third magnitude for use in the CNU-Updater step when the syndrome weight is larger than a predetermined threshold, and the second value of the two values is selected as the third magnitude for use in the CNU-Updater step when the syndrome weight is smaller or equal to the predetermined threshold.

11. The method of claim 1, further comprising computing the syndrome weight during the iterative processing of each group of one or more block-columns, and wherein:

each check node state associated to a check node comprises the syndrome bit computed from the signs of the variable-to-check messages of the associated check node and a single smallest magnitude of the variable-to-check messages of the associated check node along with its respective block-column index;

during the CNU-Updater step at a check node, the associated check node state is updated using the single magnitude of the associated check node state and a second magnitude that is selected from two values generated from the single magnitude of the associated check node state by using two different predictive magnitude maps;

the first value of the two values is selected as the second magnitude for use in the CNU-Updater step when the syndrome weight is larger than a predetermined threshold, and the second value of the two values is selected as the second magnitude for use in the CNU-Updater step when the syndrome weight is smaller or equal to the predetermined threshold;

during the CNU-Generator step at a check node, the new check-to-variable messages are computed using the single magnitude of the associated check node state and a second magnitude that is selected from two values generated from the single magnitude of the associated check node state by using two different predictive magnitude maps; and the first value of the two values is selected as the second magnitude for use in the CNU-Generator step when the syndrome weight is larger than a predetermined threshold, and the second value of the two values is selected as the second magnitude for use in the CNU-Generator step when the syndrome weight is smaller or equal to the predetermined threshold.

12. The method of claim 1, wherein:

each check node state associated to a check node comprises the syndrome bit computed from the signs of the variable-to-check messages of the associated check node and a set of smallest magnitudes of the variable-to-check messages of the associated check node along with their respective block-column indices;

a predictive magnitude map is selected from a plurality of predictive magnitude maps to generate one or more magnitudes from the magnitudes of each check node state for computing the new check-to-variable messages during the CNU-Generator step;

a variable node update function is selected from a plurality of variable node update functions to compute the new variable-to-check messages at each variable node using the channel value and the check-to-variable messages of the associated variable node as inputs; and the variable node update function is selected based on the predictive magnitude map that is used during the CNU-Generator step at each check node.

13. An apparatus for vertical layered decoding of quasi-cyclic low-density parity-check (LDPC) codes, the apparatus comprising:

a check node memory storing check node states associated to check nodes, wherein each stored check node state associated to a check node comprises a syndrome bit computed from signs of variable-to-check messages of the associated check node and a set of values comprising one or more smallest magnitudes of the variable-to-check messages of the associated check node along with a same number of respective block-column indices;

a predictive magnitude map check node update-generator (PMM-CNU-Generator) processing unit that computes new check-to-variable messages at each check node using magnitudes of the associated check node state and one or more additional magnitudes generated from the magnitudes of the associated check node state by using one or more predictive magnitude maps; and a predictive magnitude map check node update-updater (PMM-CNU-Updater) processing unit that updates the check node state of each check node by using the magnitudes of the associated check node state and one or more additional magnitudes generated from the magnitudes of the associated check node state by using one or more predictive magnitude maps.

14. The apparatus of claim 13, wherein:

each check node state associated to a check node comprises the syndrome bit computed from the signs of the variable-to-check messages of the associated check node and the set of two smallest magnitudes of the variable-to-check messages of the associated check node along with their two respective block-column indices; and the PMM-CNU-Updater processing unit updates the check node state of each check node by using the set of two smallest magnitudes of the associated check node state and a third magnitude that is selected from a plurality of magnitudes generated from the set of two smallest magnitudes of the associated check node state by using a plurality of predictive magnitude maps.

15. The apparatus of claim 13, wherein:
each check node state associated to a check node comprises the syndrome bit computed from the signs of the variable-to-check messages of the associated check node and a single smallest magnitude of the variable-to-check messages of the associated check node along with its respective block-column index;
the PMM-CNU-Generator processing unit computes the new check-to-variable messages at each check node by using the single magnitude of the associated check node state and a second magnitude that is selected from a plurality of magnitudes generated from the single magnitude of the associated check node state by using a plurality of predictive magnitude maps; and
the PMM-CNU-Updater processing unit updates the check node state of each check node by using the single magnitude of the associated check node state and a second magnitude that is selected from a plurality of magnitudes generated from the single magnitude of the associated check node state by using a plurality of predictive magnitude maps.

16. The apparatus of claim 13, further comprising a variable node update module that uses a plurality of variable node update functions, wherein:
each check node state associated to a check node comprises the syndrome bit computed from the signs of the variable-to-check messages of the associated check node and a set of smallest magnitudes of the variable-to-check messages of the associated check node along with their respective block-column indices;
the PMM-CNU-Generator processing unit selects a predictive magnitude map from a plurality of predictive magnitude maps to generate one or more magnitudes from the magnitudes of each check node state for computing the new check-to-variable messages at each check node;
the variable node update module selects a variable node update function from a plurality of variable node update functions to compute the new variable-to-check messages at each variable node using the channel value and the check-to-variable messages of the associated variable node as inputs; and
the variable node update module selects the variable node update function based on the predictive magnitude map that is used at each check node by the PMM-CNU-Generator processing unit.

* * * * *